United States Patent
Feldman

(10) Patent No.: US 8,924,814 B2
(45) Date of Patent: Dec. 30, 2014

(54) WRITE MANAGEMENT USING PARTIAL PARITY CODES

(75) Inventor: Timothy Richard Feldman, Louisville, CO (US)

(73) Assignee: Seagate Technology LLC, Cupertino, CA (US)

( * ) Notice: Subject to any disclaimer, the term of this patent is extended or adjusted under 35 U.S.C. 154(b) by 134 days.

(21) Appl. No.: 13/596,436

(22) Filed: Aug. 28, 2012

(65) Prior Publication Data

US 2014/0068397 A1 Mar. 6, 2014

(51) Int. Cl.
*H03M 13/00* (2006.01)
*H03M 13/29* (2006.01)

(52) U.S. Cl.
CPC .............................. *H03M 13/2909* (2013.01)
USPC .......................................... 714/755; 714/801

(58) Field of Classification Search
CPC ................................................ H03M 13/2957
USPC ................................................. 714/755, 801
See application file for complete search history.

(56) References Cited

U.S. PATENT DOCUMENTS

| | | | |
|---|---|---|---|
| 4,555,784 A | 11/1985 | Wood | |
| 5,504,759 A * | 4/1996 | Inoue et al. | 714/755 |
| 5,974,225 A * | 10/1999 | Iwamoto et al. | 386/241 |
| 5,974,580 A | 10/1999 | Zook et al. | |
| 6,574,774 B1 | 6/2003 | Vasiliev | |
| 6,986,097 B1 | 1/2006 | Ireland et al. | |
| 7,240,277 B2 * | 7/2007 | Anderson et al. | 714/805 |
| 7,382,673 B2 * | 6/2008 | Hummler | 365/222 |
| 7,430,701 B2 | 9/2008 | Chen | |
| 7,496,785 B2 * | 2/2009 | Elliot et al. | 714/6.2 |
| 7,613,983 B2 * | 11/2009 | Moriyama et al. | 714/769 |
| 7,647,526 B1 | 1/2010 | Taylor | |
| 7,917,833 B2 * | 3/2011 | Mizuochi et al. | 714/776 |
| 8,078,949 B2 * | 12/2011 | Sadakata et al. | 714/801 |
| 8,255,764 B1 * | 8/2012 | Yeo et al. | 714/758 |
| 8,271,850 B2 * | 9/2012 | Efimov et al. | 714/758 |
| 2012/0166910 A1 * | 6/2012 | Baek et al. | 714/758 |

* cited by examiner

*Primary Examiner* — Esaw Abraham
(74) *Attorney, Agent, or Firm* — HolzerIPLaw, PC

(57) ABSTRACT

A partial outer parity management system generates a product code based on a partial data block write to a data block and partial outer parity generated by a previous partial data block write to the data block. In one implementation, a storage device includes cache storage circuit accessible by the parity generator, the cache storage circuit being configured to cache the partial outer parity generated by the previous partial data block write to the data block in a partial outer parity cache designated for association with the product code.

19 Claims, 12 Drawing Sheets

WRITE MANAGEMENT USING PARTIAL PARITY CODES

SUMMARY

Implementations described and claimed herein address the foregoing problems by generating a product code based on a partial data block write to a data block and partial outer parity generated by a previous partial data block write to the data block. In one implementation, a storage device includes cache storage circuit accessible by the parity generator, the cache storage circuit being configured to cache the partial outer parity generated by the previous partial data block write to the data block in a partial outer parity cache designated for association with the product code.

Other implementations are also described and recited herein.

BRIEF DESCRIPTIONS OF THE DRAWINGS

DETAILED DESCRIPTIONS

Figure 1:
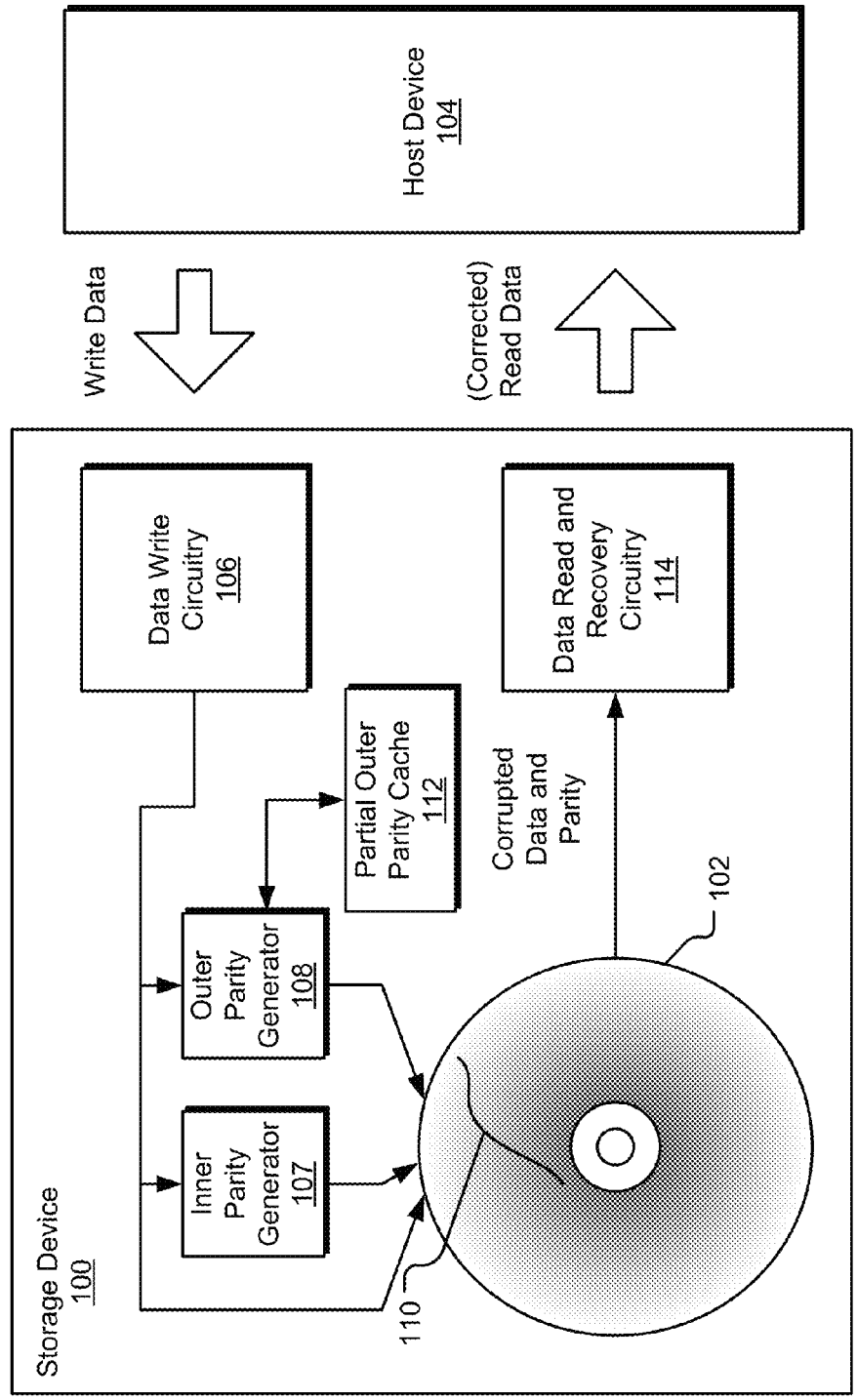
FIG. 1 illustrates an example storage device managing product codes using a partial outer parity cache.

FIG. 1 illustrates an example storage device 100 managing product codes using a partial outer parity cache. In the illustrated example, the storage device 100 represents a hard disc drive having one or more magnetic storage discs 102, although other implementations may be in the form of an optical disc drive (e.g., a CD reader/writer or a DVD reader/writer), a solid state drive (SSD), etc. The storage device 100 communicates with a host device 104, which sends write data to and receives read data from the storage device 100.

For example, the host device 104 can write a data file to the storage device 100, which records the data file on the magnetic storage disc 102, and can later read the data file from the storage device 100. The storage device 100 includes write channel having data write circuitry 106, which encodes and serializes the data into data symbols, each symbol being defined by a number of data bits. Symbols have a size in terms of a number of bits. Symbol size is not limited to any particular number of bits but can vary depending on the encoding scheme used by the storage device 100. The data symbols are then recorded on the magnetic storage disc 102 in units referred to as "data blocks."

The data symbols recorded on the magnetic storage disc 102 can be damaged by a variety of environmental factors, such as a scratch 110 on the surface of the magnetic storage disc 102. Such a scratch can, for example, damage the magnetic storage cells in which individual data bits are stored and/or prevent accurate reading of the data bit from the magnetic storage cells. Many other factors may prevent accurate reading and writing of the individual data bits, including instability in a magnetic cell, read and write channel communications errors, etc. The write channel also includes an inner parity generator 107 and an outer parity generator 108, which process data symbols from the data write circuitry 106 and generate redundancy information in the form of inner and outer parity data respectively to provide error detection and/or correction. The write data received from the host device 104 are inputs to the inner parity generator 107, and the outer parity generator 108, which write the generated inner and outer parity data to the magnetic storage disc 102 into one or more product codes with the write data.

In the illustrated implementation, the outer parity generator 108 has access to a partial outer parity cache 112 for storing and retrieving partial outer parities generated for individual product codes in response to a partial data block write to a product code. As a result, the outer parity generator 108 can extend the partial outer parity from the partial outer parity cache 112 into a complete or full outer parity when the rest of the data block is written to the product code on the magnetic storage disc 102.

Data read and recovery circuitry 114 can read the product code from the magnetic storage disc 102 and use the inner and outer parity data in the product code to detect and/or correct errors (such as data errors caused by scratch damage on the magnetic storage disc 102). The data read and recovery circuitry 114 then transfers the read data (which may be corrected read data) to the host device 104.

Figure 2:
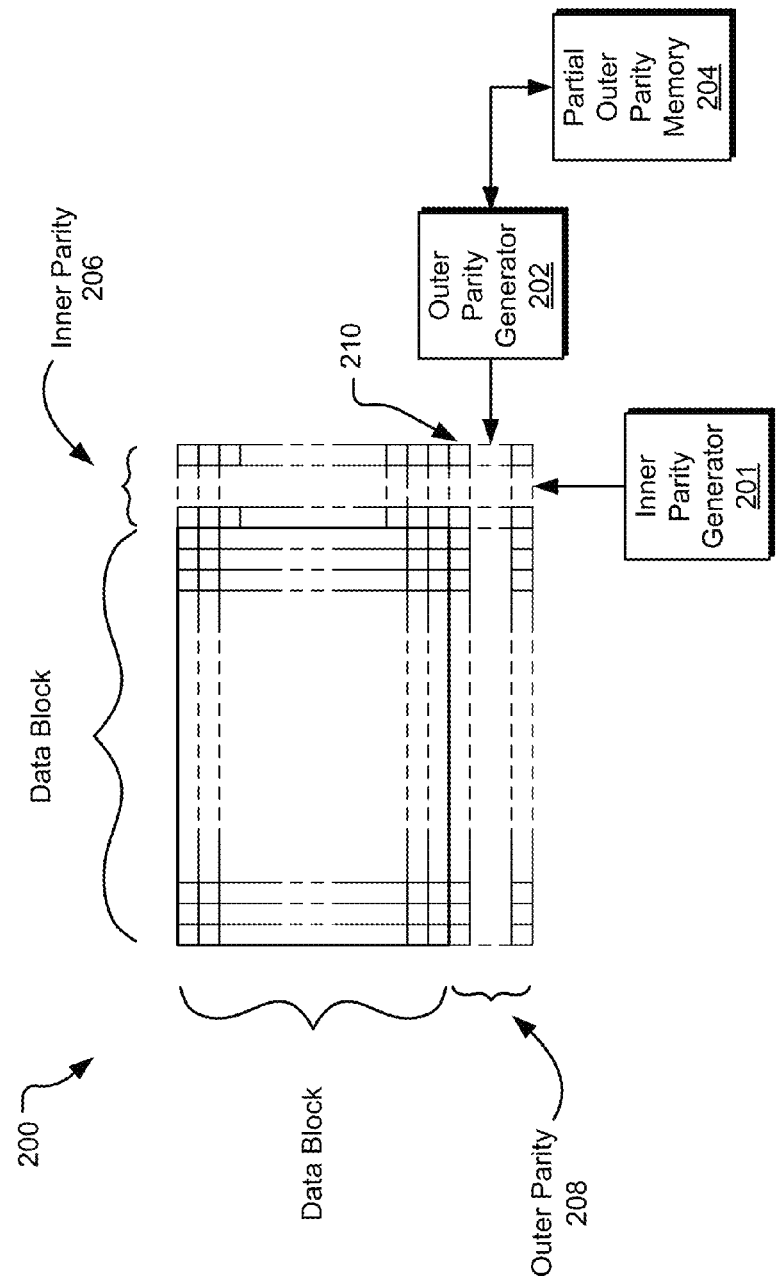
FIG. 2 illustrates an example product code managed by an inner parity generator, an outer parity generator, and a partial outer parity cache.

FIG. 2 illustrates an example product code 200 managed by an inner parity generator 201, an outer parity generator 202, and a partial outer parity cache 204. The product code 200 includes a data block (designated by the curly brackets marked "data block"), an inner parity 206, an outer parity 208, and an intersection 210 of the inner parity and the outer parity. Each row of data and inner parity 206 forms a systematic codeword. Each column of data and outer parity 208 forms a systematic codeword. The data block represents digital host data written to a storage medium, such as a magnetic storage disc or a solid-state drive (SSD), and each row of the data block represents an atomic write to the storage medium.

Each row of the inner parity 206 represents redundancy information relating to the corresponding row of the data block. Accordingly, depending on the robustness of the redundancy information, a number of bit errors in a row of a data block can be detected, located, and/or corrected based on the redundancy information in the corresponding row of the inner parity 206. In one implementation, the inner parity generator 201 writes the corresponding inner parity information corresponding to each atomic write to the data block, such that each row of inner parity is current with each row of the data block.

Each column of the outer parity 208 represents redundancy information relating to the corresponding column of the data block. Accordingly, depending on the robustness of the redundancy information, a number of bit errors in a column of a data block can be detected, located, and/or corrected based on the redundancy information in the corresponding column of the outer parity 208. In one implementation, the outer parity generator 202 writes the corresponding outer parity information corresponding to a complete write of the data block, such that each column of outer parity 208 is current with each column of the data block. However, if only part of the data block is written to the product code, the outer parity 208 may not be updated. Accordingly, a partial data block write can result in out-of-date or invalid outer parity information.

In one implementation, to record the outer parity of the partial data block write, the outer parity generator 202 generates a partial outer parity corresponding the partial data block write and stores the partial outer parity in a partial outer parity cache 204 in association with the product code (e.g., each product code has partial outer parity cache space allocated to it). The columns of the data and the partial outer parity form a systematic codeword. That is, each column of the partial outer parity represents redundancy information relating to the corresponding column of the partial data block. Accordingly, depending on the robustness of the redundancy information, a number of bit errors in a column of a partial data block can be detected, located, and/or corrected based on the redundancy information in the corresponding column of the partial outer parity. When the rest of the data block is written in a subsequent write operation, the parity generator 202 retrieves the partial outer parity from the partial outer parity cache 204 and extends the outer parity to accommodate the subsequent partial data block write operation. This process is described in more detail with regard to subsequent figures. It should be understood that, in one implementation, the first data block write starts at the beginning of the data block, and the second data block write starts where the first data block write ended.

Figure 3:
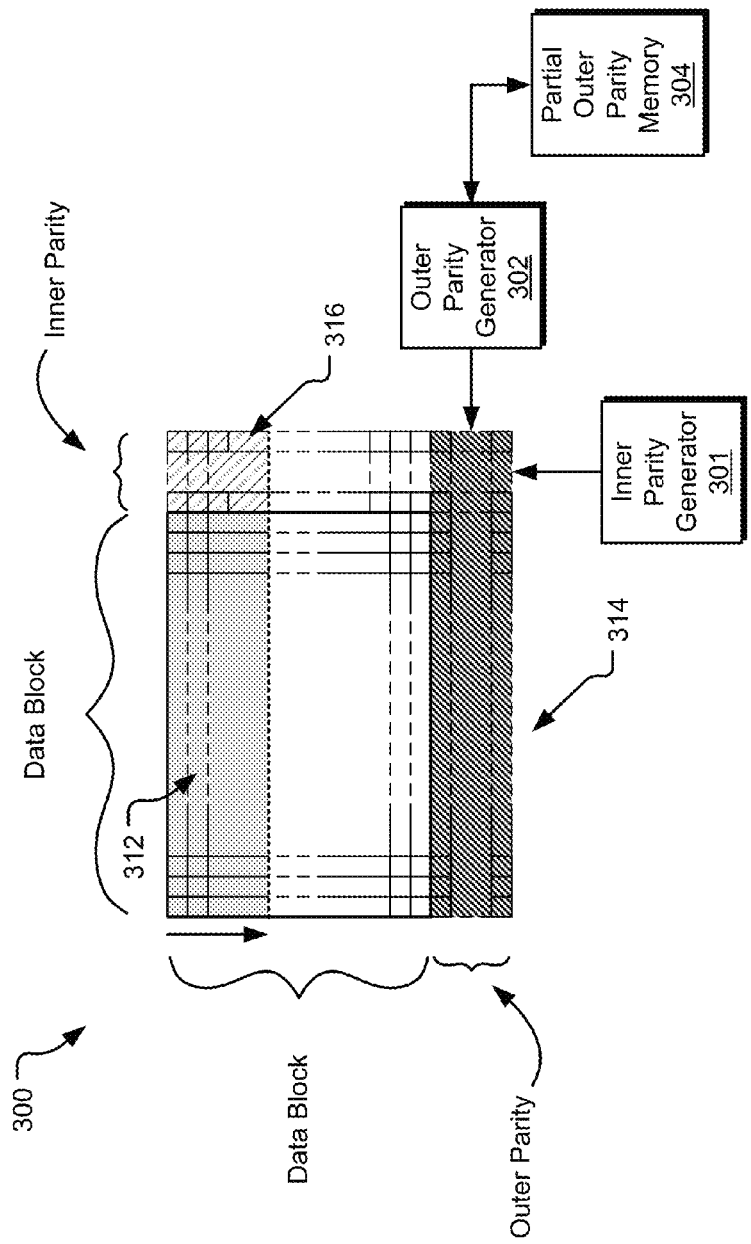
FIG. 3 illustrates an example product code managed by an inner parity generator, an outer parity generator, and a partial outer parity cache, with a partial data block write and an invalid outer parity.

FIG. 3 illustrates an example product code 300 managed by an inner parity generator 301, an outer parity generator 302 and a partial outer parity cache 304, with a partial data block write (as shown by light grey region 312) and an invalid outer parity (as shown by dense cross-hatched region 314). The inner parity (as shown by the sparse cross-hatching 316) is updated with each atomic write and is therefore valid. In contrast, data block columns include the new partial data block write bits and the prior data bits and yet the outer parity 314 is not updated with the partial data block write. As such, the outer parity 314 is invalid relative to the bits now written in the data block. In one implementation, however, the partial outer parity (e.g., the outer parity for the partial data block write bits) for the partial data block write is generated by the outer parity generator 302 and stored in the partial outer parity cache 304 in a storage space allocated for the product code 300.

Figure 4:
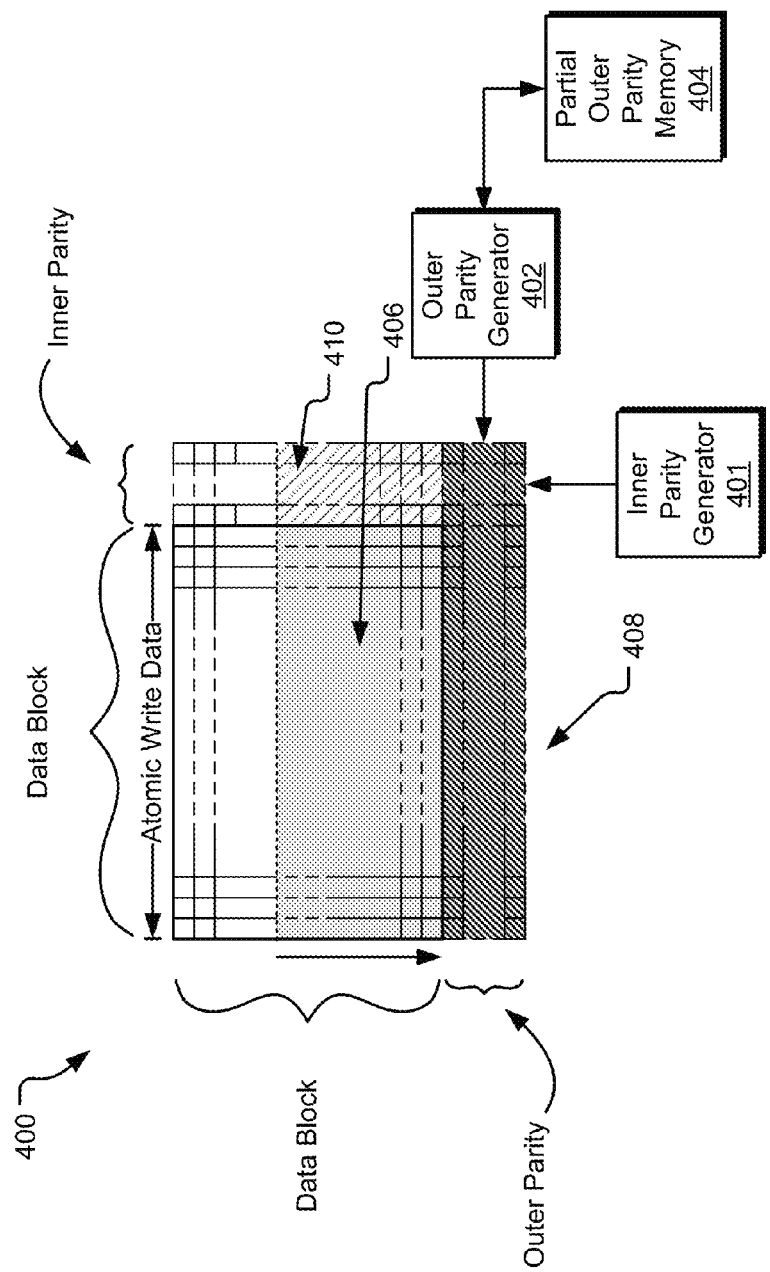
FIG. 4 illustrates an example product code managed by an inner parity generator, an outer parity generator, and a partial outer parity cache, with a second partial data block write and an invalid outer parity.

FIG. 4 illustrates an example product code 400 managed by an inner parity generator 401, an outer parity generator 402 and a partial outer parity cache 404, with a second partial data block write (as shown by light grey region 406) and an invalid outer parity (as shown by dense cross-hatched region 408). The inner parity (as shown by the sparse cross-hatching 410) of each row is updated with each atomic write and is therefore valid. In contrast, data block columns include the new partial data block write bits and the prior data bits and yet the outer parity 408 is not yet updated based on the data from the partial data block write. As such, the outer parity 408 is invalid relative to the bits now written in the data block.

However, during this second partial data block write, the outer parity generator 402 retrieves from the partial outer parity cache 404 the partial outer parity generated for the first partial data block write (refer to FIG. 3) and computes the outer parity for the entire data block. This outer parity generation operation generates an updated outer parity based on the data of the entire, newly completed data block (i.e., both the first and second partial data block writes). As a result, after completion of the second partial data block write, the outer parity generator 402 completes the generation of the valid outer parity based on the data of the entire data block, which is written to the product code as described with regard to FIG. 5.

Although other implementations may be employed, in one implementation, the partial outer parity $OP_1$ and the extension of the partial outer parity $OP_1$ into a complete or full outer parity OP may be accomplished as follows:

$OP_1 = d(x_1) \cdot x_1^r \mod g(x_1)$, where $x_1$ is the data from the first partial data block write. r is the number of parity symbols, and $g(x)$ is the parity generator polynomial; and $OP = OP_1 + d(x_2) \cdot x_2^r \mod g(x_2)$, where $x_2$ is the data from the second partial data block write.

Figure 5:
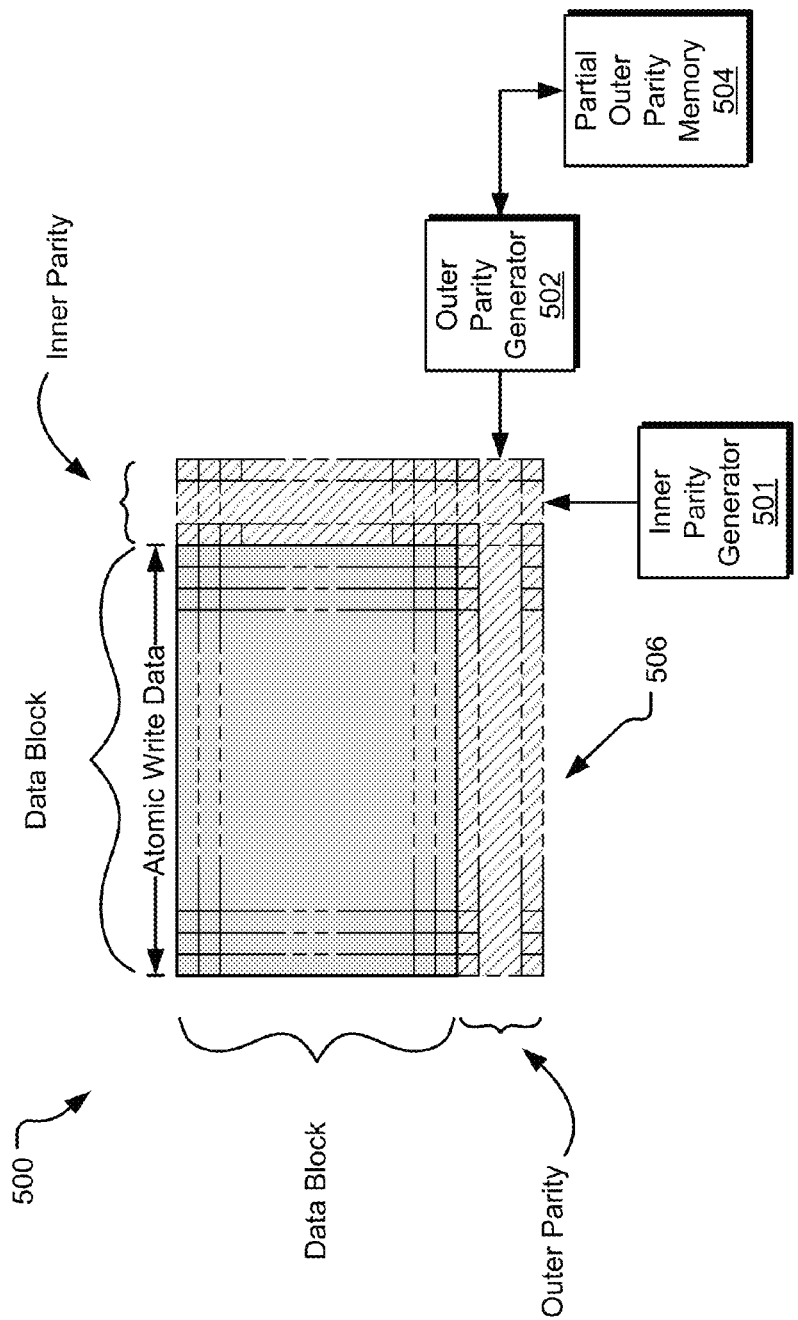
FIG. 5 illustrates an example product code managed by an inner parity generator, an outer parity generator, and a partial outer parity cache with a valid outer parity based on a cached partial outer parity from a first partial data block write and the data written in a second partial data block write.
Figure 6:
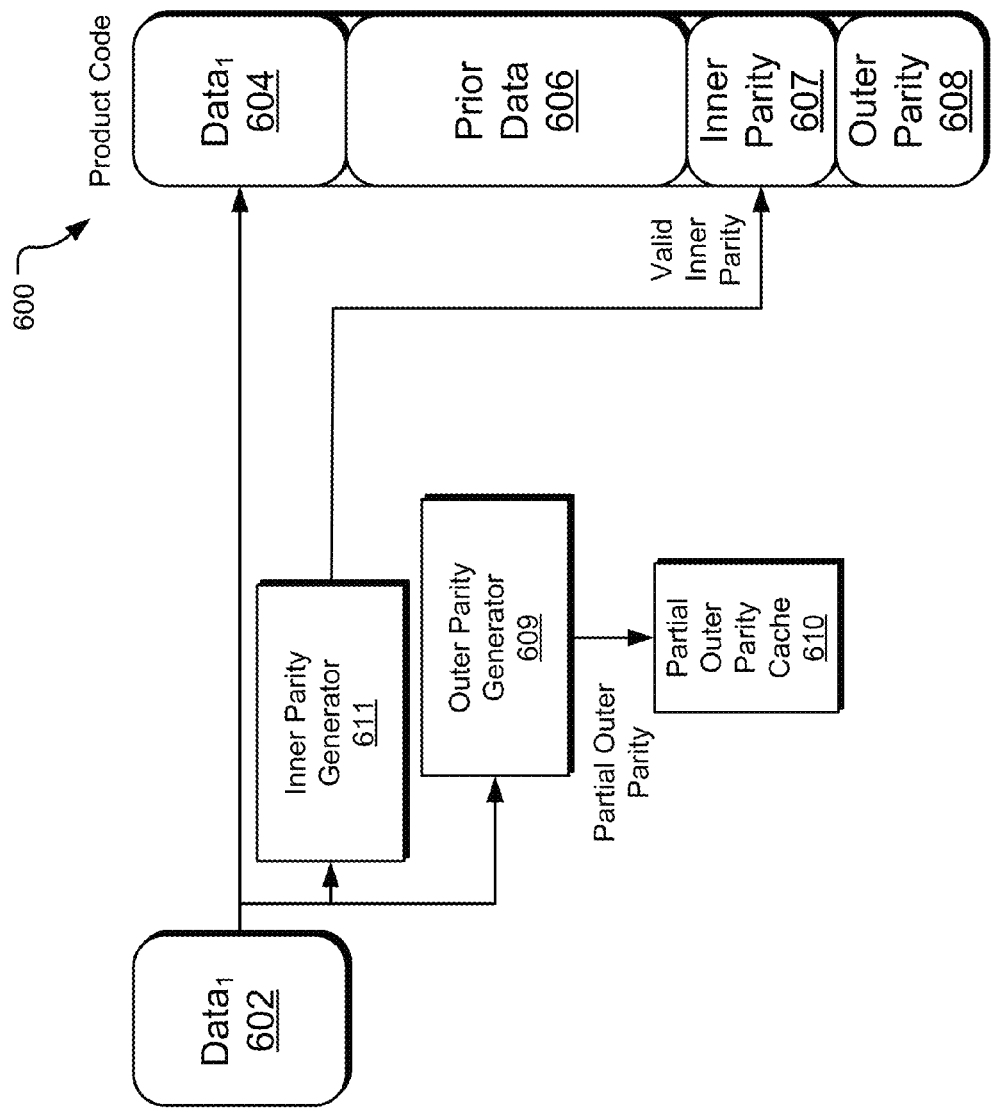
FIG. 6 illustrates an example partial data block write to a product code.

FIG. 5 illustrates an example product code 500 managed by an inner parity generator, 501, an outer parity generator 502, and a partial outer parity cache 504 with a valid outer parity 508 based on a stored partial outer parity from a first partial data block write and the data written in a second partial data block write. At the completion of the second partial data block write, the outer parity generator 502 writes the newly generated outer parity to the product code 500. The outer parity 506 of the product code 500 is now valid, as it is generated based on a stored partial outer parity retrieved from a first partial data block write and the data written in a second partial data block write FIG. 6 illustrates an example partial data block write to a product code 600. Data (designated as $Data_1$ 602) is written in a partial data block write (as shown as $Data_1$ 604) in the product code 600. The prior data 606 of the product code 600 represents the data remaining in the portion of the product code 600 that was not overwritten in the partial data block write depicted in FIG. 6. The partial data block write also invalidates the outer parity of parity 608 in the product code 600.

The $data_1$ 602 is also input to an outer parity generator 609, which computes a partial outer parity, and an inner parity generator 611, which computes a valid inner parity from the $data_1$ 602. The outer parity generator 609 writes the partial outer parity (based on the partial data block write) into a partial outer parity cache 610, and the inner parity generator 611 writes the valid inner parity into the inner parity 607 of the product code 600. The $data_1$ 604 and the partial outer parity form a set of valid codewords on the columns of $data_1$ 604 in the product code 600. Accordingly, the partial outer parity stored in the partial outer parity cache 610 may be used as an outer parity to detect and/or restore errors in the data written in the partial data block write, although the outer parity stored in outer parity 608 of the product code 600 is no longer valid for detecting and/or restoring errors in the prior data 606.

Figure 7:
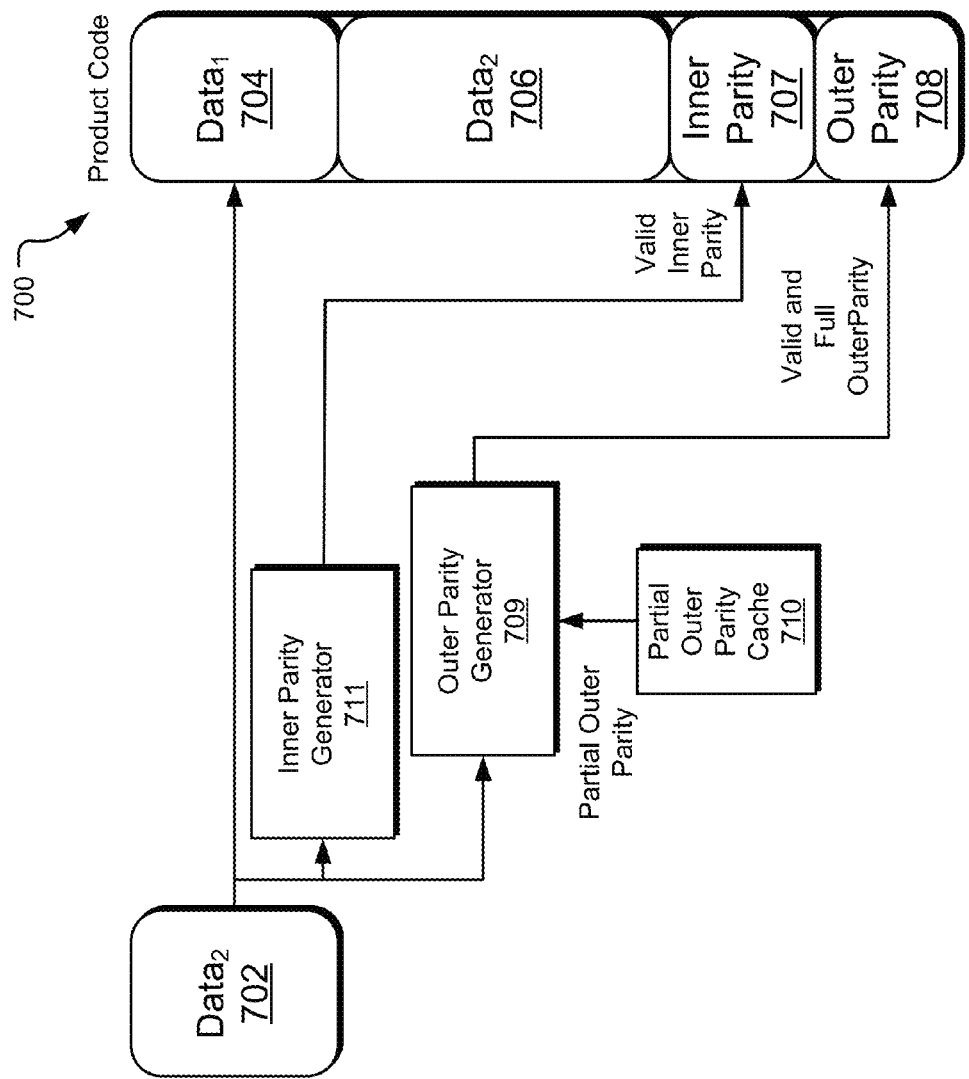
FIG. 7 illustrates an example second partial data block write to a product code.

FIG. 7 illustrates an example second partial data block write to a product code 700. Data (designated as $Data_2$ 702) is written in a partial data block write (as shown as $Data_2$ 706) in the product code 700. The $Data_1$ 704 of the product code 700 represents the data written in a prior partial data block write (e.g., as described with regard to FIG. 6). The $data_2$ 702 is also input to an inner parity generator 711, which computes a valid inner parity from the $data_2$ 702 and writes the valid inner parity into the inner parity 707 of the product code 700.

The $data_2$ 702 is also input to an outer parity generator 709, which retrieves a partial outer parity from a partial outer parity cache 710 and extends the partial outer parity based on the $data_2$ 702 to generate a complete and valid outer parity based on the $data_1$ 704 and the $data_2$ 706. The outer parity generator 709 writes the complete and valid outer parity of the combined data block (including $data_1$ 704 and $data_2$ 706) into the outer parity 708 of the product code 700.

Figure 8:
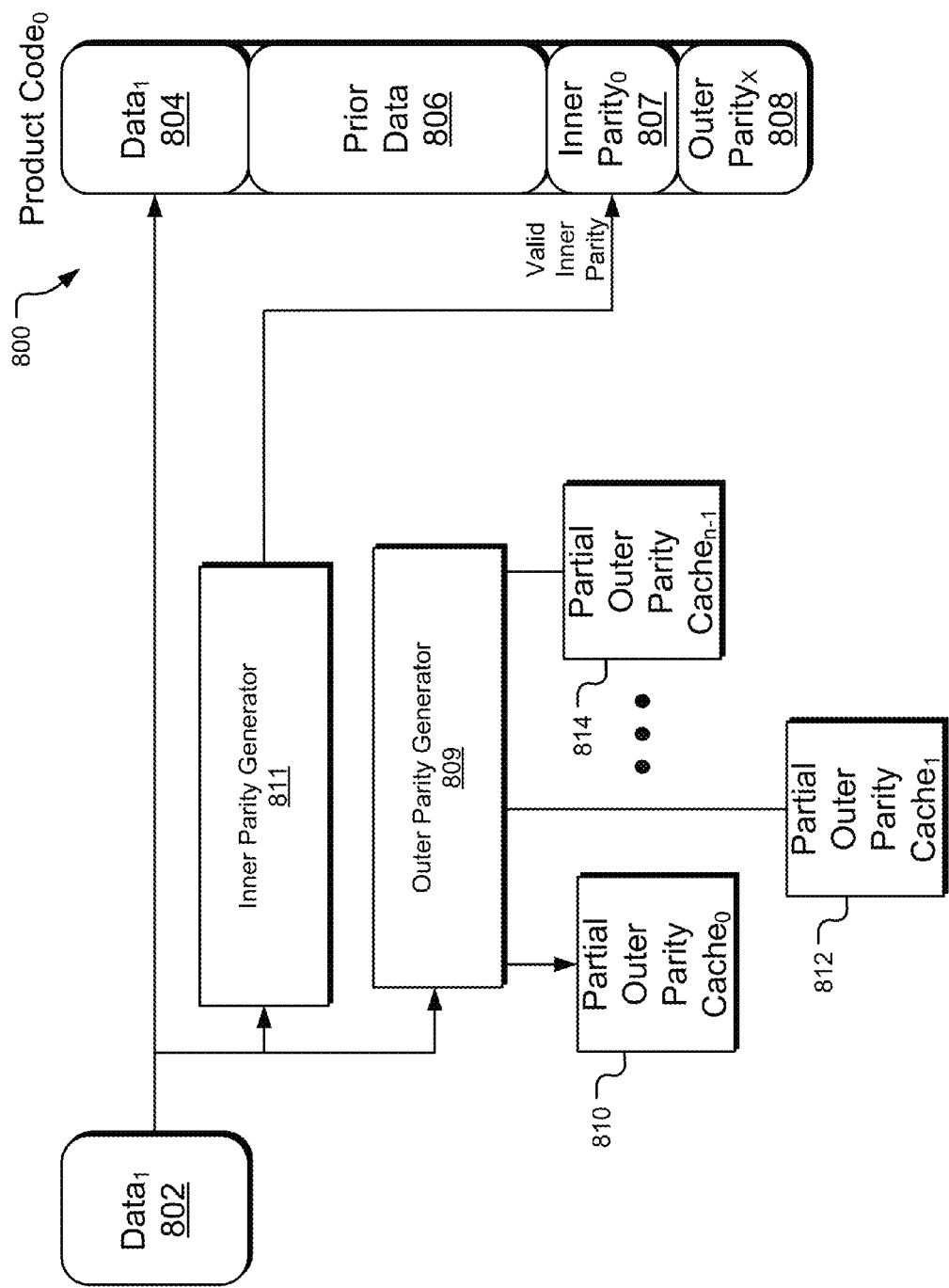
FIG. 8 illustrates an example partial data block write to a first product code.

FIG. 8 illustrates an example partial data block write to a first product code 800. Data (designated as $Data_1$ 802) is written in a partial data block write (as shown as $Data_1$ 804) in the product code 800. The prior data 806 of the product code 800 represents the data remaining in the portion of the product code 800 that was not overwritten in the partial data block write depicted in FIG. 8. The partial data block write also invalidates the outer parity of outer parity 808 in the product code 800. The $data_1$ 802 is also input to an inner parity generator 811, which computes a valid inner parity from the $data_1$ 802 and writes the valid inner parity into the inner parity 807 of the product code 800.

The $data_1$ 802 is also input to an outer parity generator 809, which computes a partial outer parity from the $data_1$ 802. The outer parity generator 809 is communicatively coupled to n partial outer parity caches 810, 812, and 814, one partial outer parity cache for each product code that may concurrently have a partial outer parity cached (where the storage device supports up to n product codes in this state). The partial outer parity caches 810, 812, and 814 may be embodied by separate logical partitions in one or more physical memory devices, a separate physical memory device for each product code supported by the storage device, or some combination of the two configurations and/or of other configurations. In one implementation, the prior data 806 is invalid, and so the partial outer parity caches 810, 812, and 814 may be embodied by the storage media previously used for the prior data 806. The outer parity generator 809 writes the partial outer parity (based on the partial data block write) into a partial outer parity cache 810. In one implementation, the partial outer parity stored in the partial outer parity cache 810 may be used as a partial outer parity to detect and/or restore errors in the data written in the partial data block write, although the outer parity 808 of the product code 800 is no longer valid for detecting and/or restoring errors in the prior data 806 (as designated by the "X" subscript).

Figure 9:
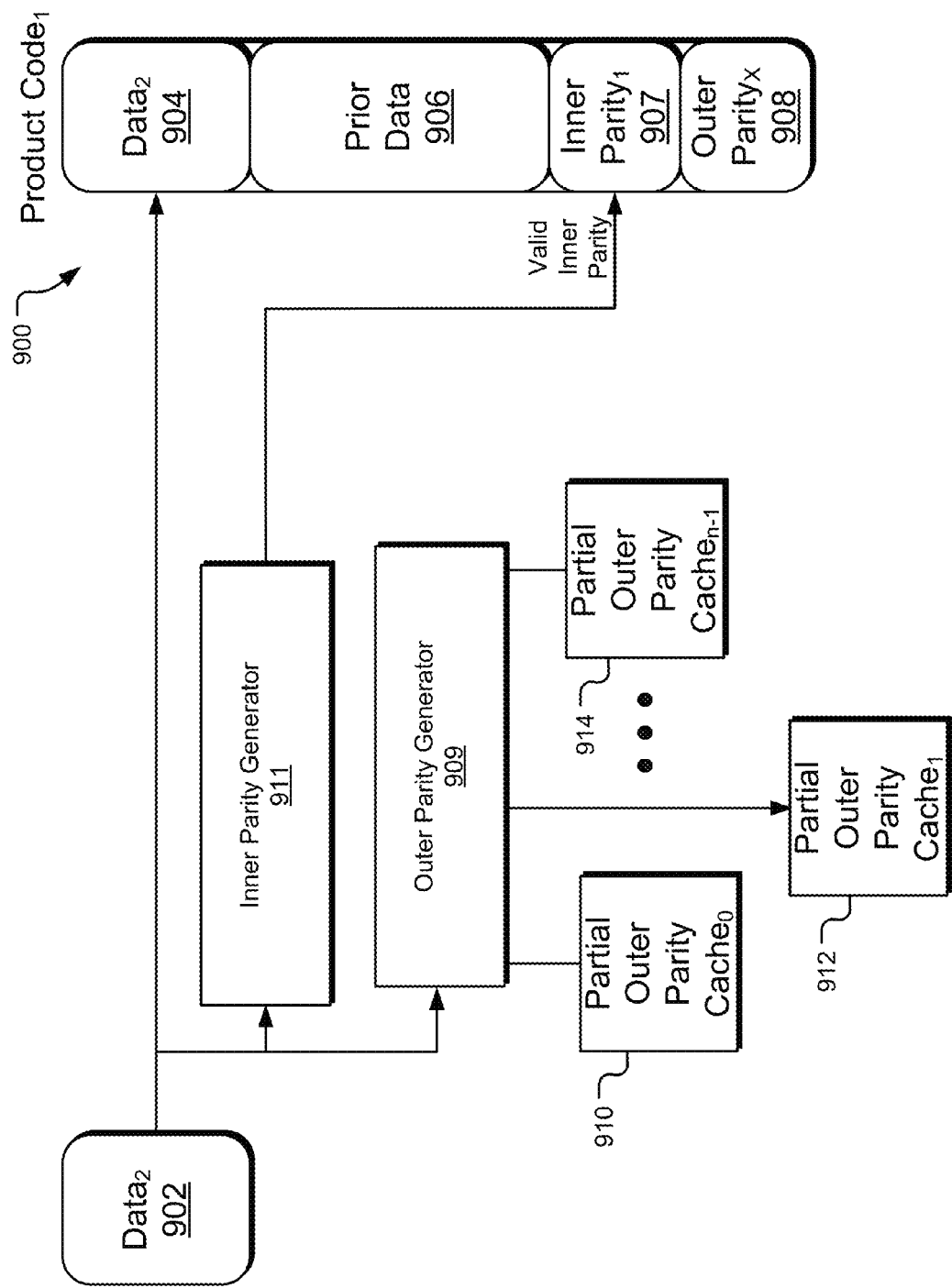
FIG. 9 illustrates an example partial data block write to a second product code.

FIG. 9 illustrates an example partial data block write to a second product code 900. Data (designated as $Data_2$ 902) is written in a partial data block write (as shown as $Data_2$ 904) in the product code 900. The prior data 906 of the product code 900 represents the data remaining in the portion of the product code 900 that was not overwritten in the partial data block write depicted in FIG. 9. The partial data block write also invalidates the outer parity 908 in the product code 900. The $data_2$ 902 is also input to an inner parity generator 911, which computes a valid inner parity from the $data_2$ 902 and writes the valid inner parity into the inner parity 907 of the product code 900.

The $data_2$ 902 is also input to an outer parity generator 909, which computes a partial outer parity and a valid inner parity from the $data_2$ 902. The outer parity generator 909 is communicatively coupled to n partial outer parity caches 910, 912, and 914, one partial outer parity cache for each product code that may concurrently have a partial outer parity cached. The partial outer parity caches 910, 912, and 914 may be embodied by separate logical partitions in one or more physical memory devices, a separate physical memory device for each product code supported by the outer parity generator, or some combination of the two configurations and/or of other configurations. In one implementation, the prior data 906 is invalid, and so the partial outer parity caches 910, 912, and 914 may be embodied by the region of the storage media previously used for the prior data 906. The outer parity generator 909 writes the partial outer parity (based on the partial data block write) into a partial outer parity cache. In one implementation, the partial outer parity stored in the partial outer parity cache 912 may be used as a partial outer parity to detect and/or restore errors in the data written in the partial data block write, although the outer parity stored in outer parity 908 of the product code 900 is no longer valid for detecting and/or restoring errors in the prior data 906 (as designated by the "X" subscript).

Figure 10:
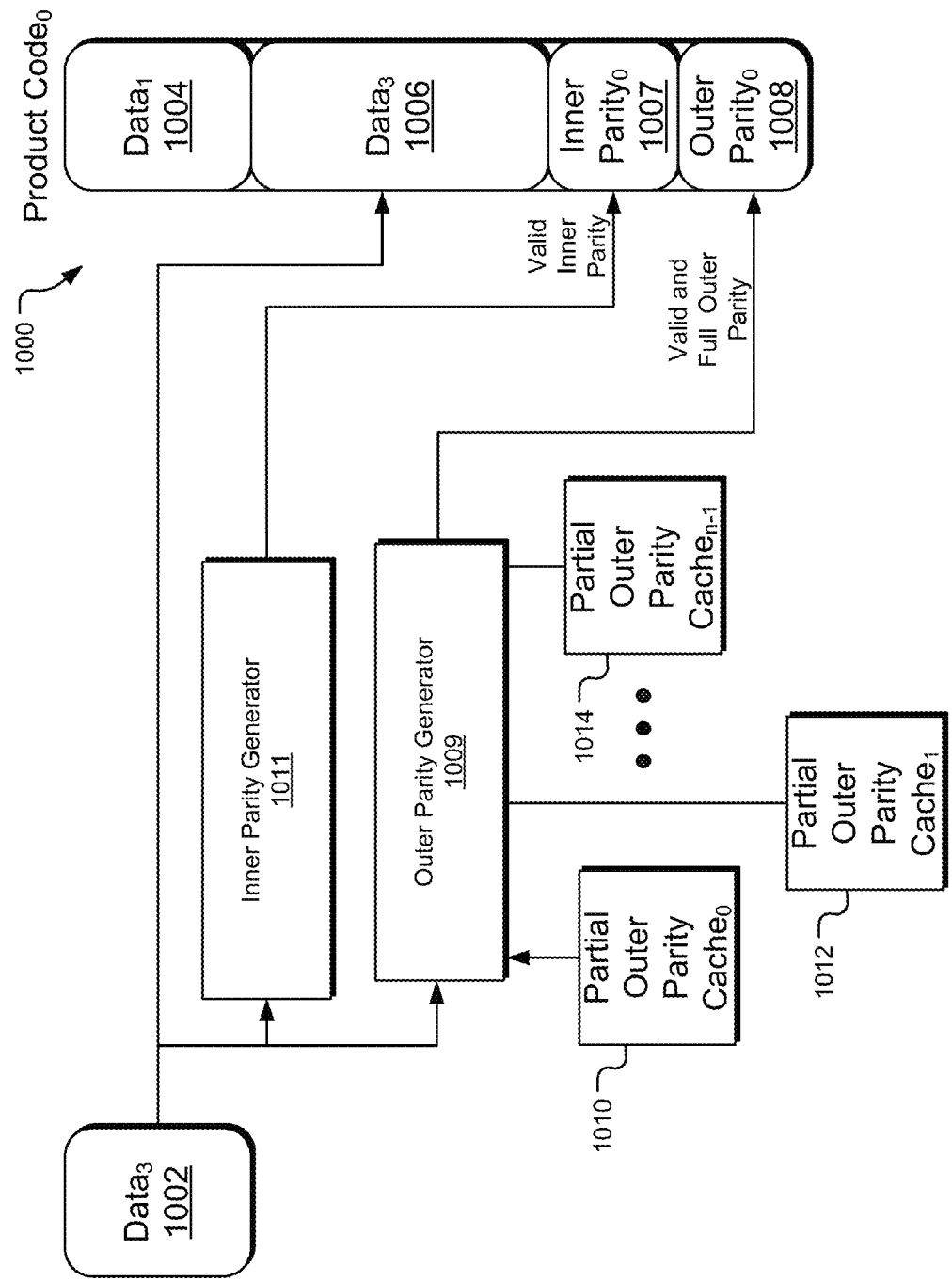
FIG. 10 illustrates an example second partial data block write to a first product code, along with a write of full outer parity.

FIG. 10 illustrates an example second partial data block write to a first product code 1000, along with a write full outer parity. Data (designated as $Data_3$ 1002) is written in a partial data block write (as shown as $Data_3$ 1006) in the product code 1000. The $Data_3$ 1004 of the product code 1000 represents the data written in a prior partial data block write (e.g., as described with regard to FIG. 8).

The $data_3$ 1002 is also input to an outer parity generator 1009, which retrieves a partial outer parity from a partial outer parity cache 1010 and extends the partial outer parity based on the $data_3$ 1002 to generate a complete, valid outer parity based on the $data_1$ 1004 and the $data_3$ 1006. The parity generator 1009 writes the complete valid outer parity of the combined data block (including $data_1$ 1004 and $data_3$ 1006) into the outer parity 1008 of the product code 1000. The inner parity generator 1011 computes the inner parity for the $data_3$ 1002 and writes the inner parity for the $data_4$ 1002 into the inner parity 1007 of the product code 1000.

Figure 11:
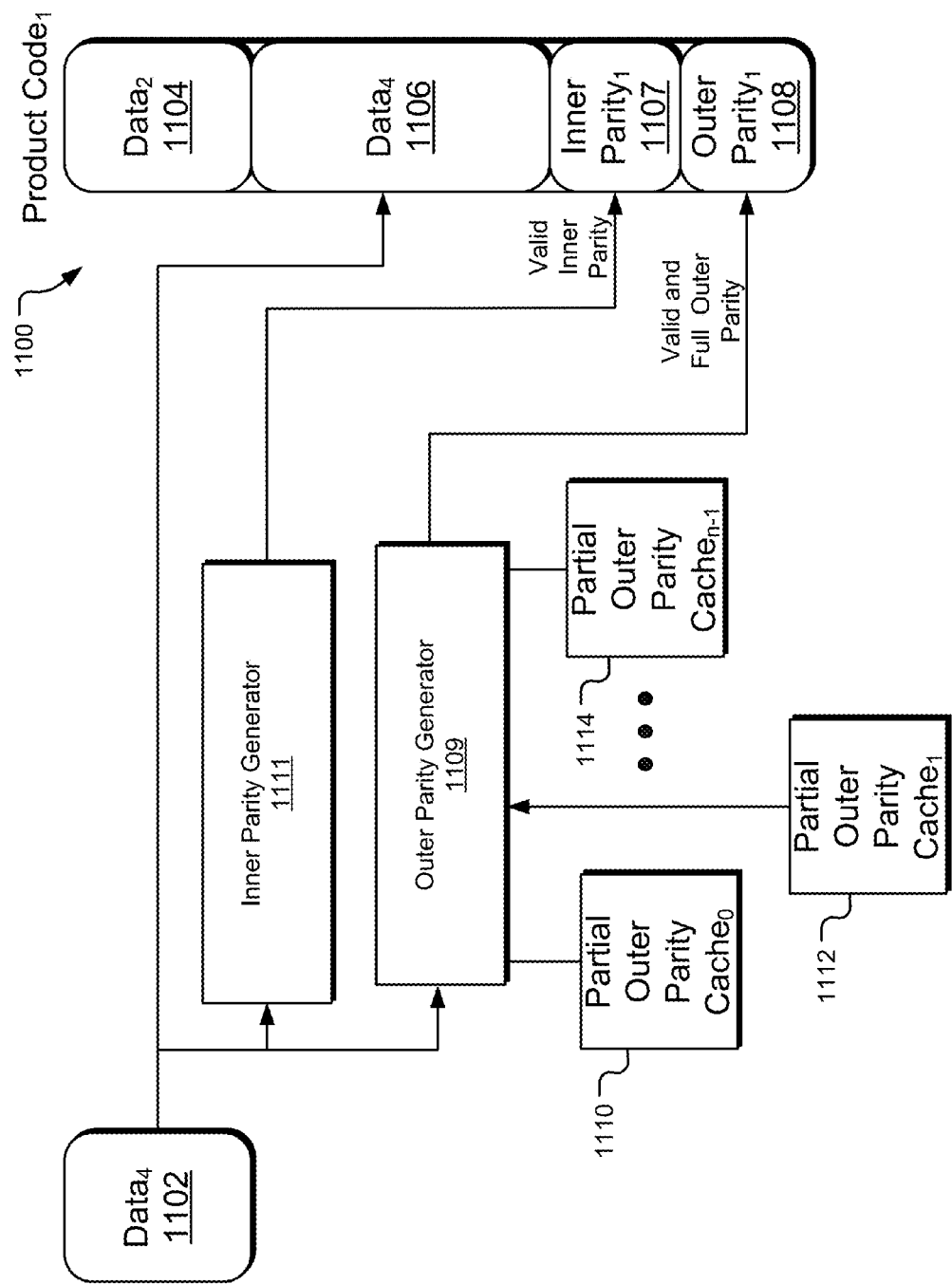
FIG. 11 illustrates an example second partial data block write to a second product code, along with a write of full outer parity.

FIG. 11 illustrates an example second partial data block write to a second product code 1100, along with a write of full outer parity. Data (designated as $Data_4$ 1102) is written in a partial data block write (as shown as $Data_4$ 1106) in the product code 1100. The $Data_4$ 1104 of the product code 1100 represents the data written in a prior partial data block write (e.g., as described with regard to FIG. 9).

The $data_4$ 1102 is also input to an outer parity generator 1109, which retrieves a partial outer parity from a partial outer parity cache 1112 and extends the partial outer parity based on the $data_4$ 1102 to generate a complete, valid outer parity based on the $data_2$ 1104 and the $data_4$ 1106. The outer parity generator 1109 writes the complete valid outer parity of the combined data block (including $data_2$ 1104 and $data_4$ 1106) into the outer parity 1108 of the product code 1100. An inner parity generator 1111 computes the inner parity for the $data_4$ 1102 and writes the inner parity for the $data_4$ 1102 into the inner parity 1107 of the product code 1100.

Figure 12:
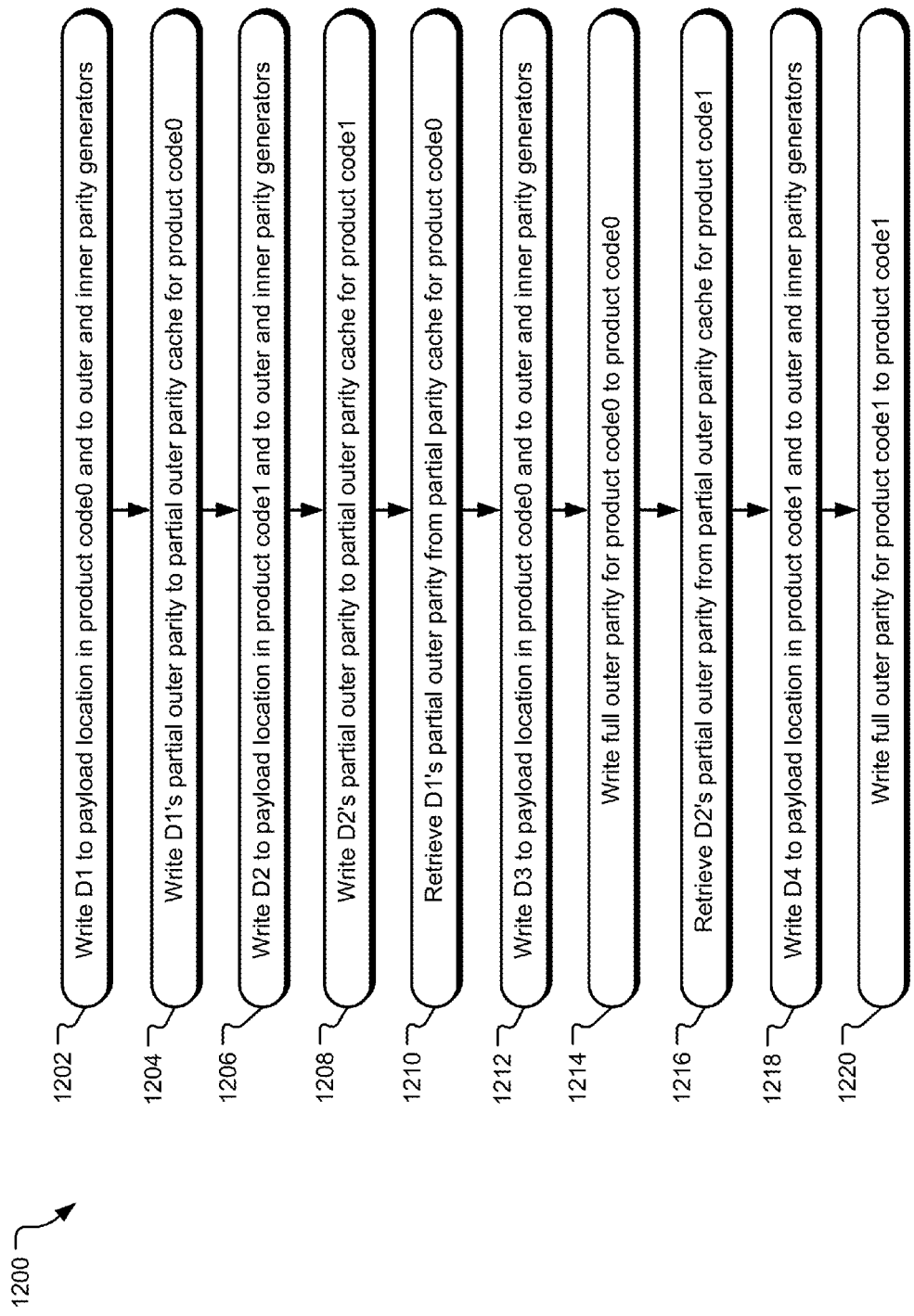
FIG. 12 illustrates example operations for managing partial outer parity in one or more product codes.

FIG. 12 illustrates example operations 1200 for managing partial outer parity in one or more product codes. A writing operation 1202 writes a partial data block D1 to a payload location in a product code0 and to inner and outer parity generators. A generation operation 1204 generates a partial outer parity for D1 and writes it to a partial outer parity cache for the product code0. In one implementation, the writing operation 1202 also generates the inner parity for D1 and writes it to an inner parity location in the product code0.

A writing operation 1206 writes a partial data block D2 to a payload location in a product code1 and to inner and outer parity generators. A generation operation 1208 generates a partial outer parity for D2 and writes it to a partial outer parity cache for the product code1. In one implementation, the writing operation 1206 also generates the inner parity for D2 and writes it to an inner parity location in the product code1.

A retrieval operation 1210 retrieves D1's partial outer parity from partial outer parity cache for product code0, responsive to receipt of a partial data block D3. A writing operation 1212 writes the partial data block D3 to a payload location in a product code0 and to inner and outer parity generators. A generation operation 1214 generates a complete valid outer parity for the combination of D1 and D3, based on the partial outer parity retrieved from the partial outer parity cache, and writes it to an outer parity location of the product code0. In one implementation, the writing operation 1212 also generates an inner parity for D3 and writes it to an inner parity location of the product code0.

A retrieval operation 1216 retrieves D2's partial outer parity from partial outer parity cache for product code1, responsive to receipt of a partial data block D4. A writing operation 1218 writes a partial data block D4 to a payload location in a product code1 and to inner and outer parity generators. A generation operation 1220 generates a complete valid outer parity for the combination of D2 and D4, based on the partial outer parity retrieved from the partial outer parity cache, and writes it to an outer parity location of the product code1. In one implementation, the writing operation 1218 also generates an inner parity for D4 and writes it to an inner parity location of the product code1.

The embodiments of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, unless explicitly claimed otherwise or a specific order is inherently necessitated by the claim language.

The data storage and/or memory may be embodied by various types of storage, such as hard disc media, optical media, solid-state drive technology, ROM, RAM, and other technology. The operations may be implemented in firmware, software, hard-wired circuitry, gate array technology and other technologies, whether executed or assisted by a microprocessor, a microprocessor core, a microcontroller, special purpose circuitry, or other processing technologies.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method comprising:
using a processor to generate a complete outer parity code based on a partial data block write to a data block and a partial outer parity generated by a previous partial data block write to the data block.

2. The method of claim 1 wherein the complete parity code is part of a complete product code.

3. The method of claim 2 further comprising:
caching the partial outer parity generated by the previous partial data block write to the data block in a partial outer parity cache designated for association with the product code.

4. The method of claim 2 wherein a storage device is populated with a plurality of product codes, each product code being allocated a distinct partial outer parity cache.

5. The method of claim 4 wherein each distinct partial outer parity cache is physically distinct from all of the other product codes.

6. The method of claim 4 wherein each distinct partial outer parity cache is logically distinct from all of the other product codes.

7. The method of claim 1 further comprising:caching the partial outer parity generated by the previous partial data block write to the data block, prior to the generating operation.

8. The method of claim 7 further comprising:
retrieving the partial outer parity from cache, prior to the generating operation.

9. A system comprising:
a parity generator configured to generate a complete outer parity code based on a partial data block write to a data block and a partial outer parity generated by a previous partial data block write to the data block.

10. The system of claim 9 wherein the complete outer parity code is part of a complete product code.

11. The system of claim 10 further comprising:
a cache storage accessible by the parity generator, the cache storage being configured to cache the partial outer parity generated by the previous partial data block write to the data block in a partial outer parity cache designated for association with the product code.

12. The system of claim 10 wherein a storage device is populated with a plurality of product codes, each product code being allocated a distinct partial outer parity cache.

13. The system of claim 12 wherein each distinct partial outer parity cache is physically distinct from all of the other product codes.

14. The system of claim 12 wherein each distinct partial outer parity cache is logically distinct from all of the other product codes.

15. The system of claim 9 further comprising:
a cache storage accessible by the parity generator, the cache storage being configured to cache the partial outer parity generated by the previous partial data block write to the data block, prior to generation of the partial outer parity.

16. The system of claim 15 wherein the parity generator is further configured to retrieve the partial outer parity from cache, prior to generation of the partial outer parity.

17. A storage device comprising:
a parity generator configured to generate a complete outer parity of a product code based on a partial data block write to a data block and partial outer parity generated by a previous partial data block write to the data block.

18. The storage device of claim 17 further comprising:
a cache storage accessible by the parity generator, the cache storage being configured to cache the partial outer parity generated by the previous partial data block write to the data block in a partial outer parity cache designated for association with the product code.

19. A method comprising:
using a processor to generate a complete outer parity code for a data block of a product code based on a partial outer parity code and a partial data block write to the data block, the partial outer parity code being generated during a previous partial data block write to the data block of the product code; and caching the partial outer parity code generated by the previous partial data block write to the data block in a partial outer parity cache designated for association with the product code.

* * * * *